(12) United States Patent
Peng et al.

(10) Patent No.: US 10,692,549 B1
(45) Date of Patent: Jun. 23, 2020

(54) MEMORY ARRAY STRUCTURE, IN-MEMORY COMPUTING APPARATUS AND METHOD THEREOF

(71) Applicant: Taiwan Semiconductor Manufacturing Co., Ltd., Hsinchu (TW)

(72) Inventors: Yung-Chow Peng, Hsinchu (TW); Chin-Ho Chang, Hsinchu (TW); Jaw-Juinn Horng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/572,604

(22) Filed: Sep. 17, 2019

(51) Int. Cl.
| | |
|---|---|
| *H03M 1/12* | (2006.01) |
| *G11C 7/12* | (2006.01) |
| *G06F 12/06* | (2006.01) |
| *H03M 1/06* | (2006.01) |
| *H03M 1/10* | (2006.01) |
| *H03M 1/80* | (2006.01) |
| *G11C 13/00* | (2006.01) |

(52) U.S. Cl.
CPC .............. *G11C 7/12* (2013.01); *G06F 12/06* (2013.01); *H03M 1/0612* (2013.01); *G11C 2013/0042* (2013.01); *G11C 2211/5614* (2013.01); *H03M 1/10* (2013.01); *H03M 1/12* (2013.01); *H03M 1/802* (2013.01)

(58) Field of Classification Search
CPC .......... H03M 1/12; H03M 1/10; H03M 1/802; G11C 2211/5614; G11C 2013/0042

USPC ................... 341/155, 126, 172; 365/158, 207
See application file for complete search history.

(56) References Cited

U.S. PATENT DOCUMENTS 6,476,753 B1 * 11/2002 Hansen ................. H03M 1/142
341/155

OTHER PUBLICATIONS

2018 ISSCC 31.1 "An Energy-Efficient SRAM with Embedded Convolution Computation for Low-Power CNN-Based Machine Learning Applications".

* cited by examiner

*Primary Examiner* — Joseph J Lauture
(74) *Attorney, Agent, or Firm* — JCIPRNET

(57) ABSTRACT

A memory array structure that includes memory columns having first bit lines and second bit lines is introduced. Each of the memory columns includes a bit line pair, a pre-charge switch pair and a first switch pair. Output voltages from the first bit lines and the second bit lines are used to generated a first average voltage and a second average voltage, respectively. One of the first average voltage and the second average voltage is a lower average voltage and another one of the first average voltage and the second average voltage is a higher average voltage. The pre-charge switch pair and the first switch pair of a selected memory column among the plurality of memory columns are controlled to repeatedly perform an incremental step to increment the lower average voltage by a step voltage until the lower average voltage is greater than the higher average voltage.

20 Claims, 6 Drawing Sheets

US 10,692,549 B1

MEMORY ARRAY STRUCTURE, IN-MEMORY COMPUTING APPARATUS AND METHOD THEREOF

BACKGROUND

Artificial intelligence (AI) Chips are one of major growths of semiconductor industry for AI applications which are computation intensive and energy hungry. In-memory computing chips are one of the key technologies to achieve low power AI chips, but an analog-to-digital converting operation in existing in-memory computing chips is non-linear and energy hunger.

As demand for high linearity and low power consumption of the analog-to-digital converting operation in the in-memory computing chip has grown recently, there has grown a need for more creative method and designs for an in-memory computing apparatus and a memory array structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
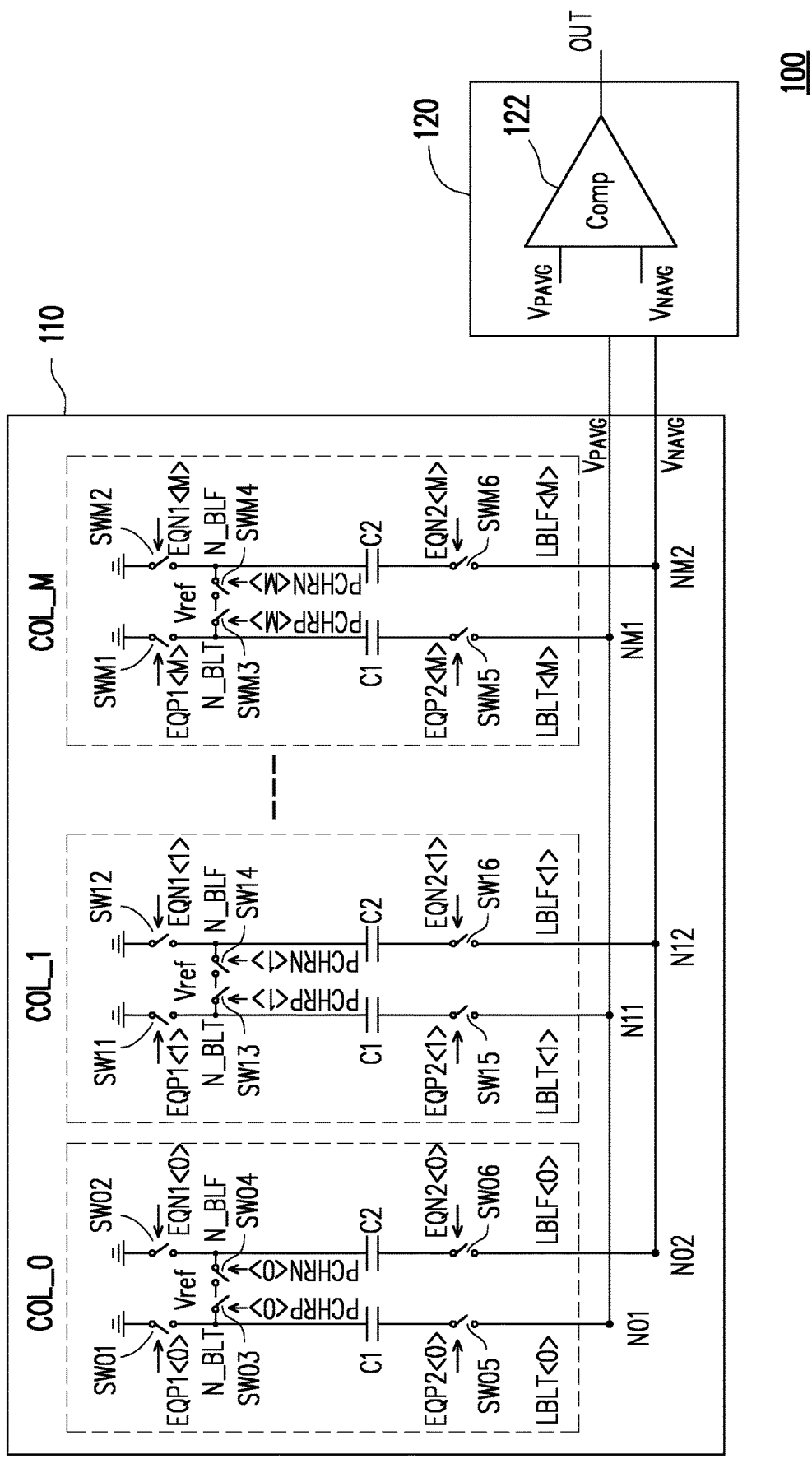
FIG. 1 is a schematic diagram illustrating an in-memory computing apparatus in accordance with some embodiments.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a schematic diagram of an in-memory computing apparatus 100 including a memory array structure 110 and an analog-to-digital converter 120 in accordance with some embodiments. The memory array structure 110 may include a plurality of memory columns COL_0 through COL_M, where M is a natural number. In some embodiments, a value of M is depended on a resolution of the analog-to-digital converter 120. For example, when the analog-to-digital converter 120 is a 6-bits analog-to-digital converter, the value of M should be 64 (or $2^6$).

The memory array structure 110 may include a plurality of first bit lines LBLT<0> through LBLT<M> and a plurality of second bit lines LBLF<0> through LBLF<M>. Each of the first bit lines LBLT<0> through LBLT<M> is associated with one of the second bit lines LBLF<0> through LBLF<M> to form complementary bit lines. The memory array structure 110 may generate an average voltage $V_{PAVG}$ according to output voltages from the first bit lines LBLT<0> through LBLT<M> and generate an average voltage $V_{NAVG}$ according to output voltages from the second bit lines LBLF<0> through LBLF<M>. In some embodiments, the output voltages from the first bit lines LBLT<0> through LBLT<M> are averaged to generate the average voltage $V_{PAVG}$; and the output voltages from the second bit lines LBTF<0> through LBLF<M> are averaged to generate the average voltage $V_{NAVG}$.

In some embodiments, the first bit lines LBLT<0> through LBLT<M> are coupled to an output line of the memory array structure 110 through connection nodes N1, N11 and NM1. The second bit lines LBLF<0> through LBLF<M> are coupled to another output line of the memory array structure 110 through connection nodes N02, N12 and NM2. The output voltages from the first bit lines LBLT<0> through LBLT<M> and the output voltages from the second bit lines LBLF<0> through LBLF<M> are provided to the output lines of the memory array structure 110 through the connection nodes N01 through NM1 and N02 through NM2.

In some embodiments, each of the memory columns COL_0 through COL_M includes a bit line pair, a pre-charge switch pair, a capacitor pair, a first switch pair and the second switch pair. The bit line pair include a bit line among the first bit lines LBLT<0> through LBLT<M> and another bit line among the second bit lines LBLF<0> through LBLF<M>. For example, the memory column COL_0 includes a bit line pair formed by the bit lines LBLT<0> and LBLF<0>; a first switch pair formed by switches SW01 and SW02, a pre-charge switch pair formed by pre-charge switches SW03 and SW04, a capacitor pair formed by capacitors C1 and C2 and a second switch pair formed by switches SW05 and SW06.

In some embodiments, the bit line pair LBLT<0> and LBLF<0> are coupled to the output lines of the memory array structure 110 through the connection nodes N01 and N02, respectively. The pre-charge switch SW03 of the pre-charge switch pair is coupled between the bit line LBTL<0> and a reference node that receives a reference voltage Vref, and is controlled by a control signal PCHRP<0>. The pre-charge switch SW04 of the pre-charge switch pair is coupled between the bit line BLTF<0> and the reference node that receives the reference voltage Vref, and is controlled by a control signal PCHRN<0>. The switch SW01 of the first switch pair is coupled between a ground node and a connection node N_BLT between the switch pre-charge SW03 and the bit line LBLT<0>. The switch SW02 of the first switch pair is coupled between the ground node and a connection node N_BLF between the pre-charge switch SW04 and the bit line LBLF<0>. The switches SW01 and SW02 are controlled by control signals EQP1<0> and EQN1<0>, respectively.

In some embodiments, the switch SW01 of the first switch pair and the pre-charge switch SW03 of the pre-charge switch pair are controlled such that the switch SW01 and the pre-charge switch SW03 have different operational states (e.g., ON and OFF states). In other words, when the switch SW01 is in an ON state, the pre-charge switch SW03 is in OFF state, and vice versa. In some embodiments, the switch SW02 of the first switch pair and the pre-charge switch SW04 of the pre-charge switch pair are controlled such that the switch SW02 and the pre-charge switch SW04 have different operational states (e.g., ON and OFF states). In other words, when the switch SW02 is in the ON state, the pre-charge switch SW04 is in the OFF state opened, and vice versa.

The capacitors C1 and C2 of the capacitor pair is associated with the bit line LBLT<0> and the bit line BLBF<0>, respectively. The capacitor C1 is coupled between the switch SW05 of the second switch pair and the connection node N_BLT, and is configured to store electric charges. Electric charge amount stored in the capacitor C1 is determined according to the operations of the switches SW01 and SW03. The capacitor C2 is coupled between the switch SW06 of the second switch pair and the connection node N_BLF, and is configured to store electric charges. Electric charge amount stored in the capacitor C2 is determined according to the operations of the switches SW02 and SW04.

In some embodiments, the switch SW05 of the second switch pair is coupled between the capacitor C1 and the connection node N01, and is controlled by a control signal EQP2<0>. The switch SW06 of the second switch pair is coupled between the capacitor C2 and the connection node N02, and is controlled by a control signal EQN2<0>. The switches SW05 and SW06 of the second switch pair are configured to respectively control the supply of the output voltages from the bit lines LBLT<0> and LBLF<0> to the output lines of the memory array structure 110. For example, when the switches SW05 and SW06 are opened, the output voltages from the bit lines LBLT<0> and LBLF<0> are isolated from the output lines of the memory array structure 110. When the switches SW05 and SW06 are closed, the output voltages from the bit lines LBLT<0> and LBLF<0> are supplied to the output lines of the memory array structure 110 through the connection nodes N01 and N02.

Similarly, the memory column COL_1 includes a bit line pair formed by bit lines LBLT<1> and LBLF<1>, a first switch pair formed by switches SW11 and SW12, a pre-charge switch pair formed by switches SW13 and SW14, a capacitor pair formed by capacitors C1 and C2 and a second switch pair formed by switches SW15 and SW16. The memory column COL_M includes a bit line pair formed by bit lines LBLT<M> and LBLF<M>, a first switch pair formed by switches SWM1 and SWM2, a pre-charge switch pair formed by switches SWM3 and SWM4, a capacitor pair formed by capacitors C1 and C2 and a second switch pair formed by switches SWM5 and SWM6. Components and structures of each of the memory columns COL_1 through COL_M are similar to the components and structures of the memory column COL_0, thus the detailed description of the memory columns COL_1 through COL_M is omitted hereafter.

In some embodiment, the analog-to-digital converter 120 is coupled to the memory array structure 110 to receive the average voltages $V_{PAVG}$ and $V_{NAVG}$ from the memory array structure 110. The analog-to-digital converter 120 may include a comparator 122 is configured to compare the average voltages $V_{PAVG}$ and $V_{NAVG}$ to determine which one is a lower average voltage and which one is a higher average voltage. In some embodiments, the comparator 122 may compare a level of the average voltage $V_{PAVG}$ and a level of the average voltage $V_{NAVG}$. When the level of the average voltage $V_{PAVG}$ is smaller than the level of the average voltage $V_{NAVG}$, the average voltage $V_{PAVG}$ is the lower average voltage and the average voltage $V_{NAVG}$ is the higher average voltage. When the level of the average voltage $V_{PAVG}$ is not smaller than the level of the average voltage $V_{NAVG}$, the average voltage $V_{PAVG}$ is the higher average voltage and the average voltage $V_{NAVG}$ is the lower average voltage. The comparator 122 may output an output signal OUT according to a comparison result between the averages voltages $V_{PAVG}$ and $V_{NAVG}$.

The analog-to-digital converter 120 may generate a digital code according to the output signal OUT of the comparator 122. In some embodiments, an incremental step is repeatedly performed to increment the lower average voltage until an output state of the comparator 122 changes (e.g., when the lower voltage become greater than the higher voltage as a result of repeatedly performing the incremental step). The number of the incremental step performed to the lower average voltage until the output state of the comparator changed is used to generate the digital code of the analog-to-digital converter 120.

Figure 2:
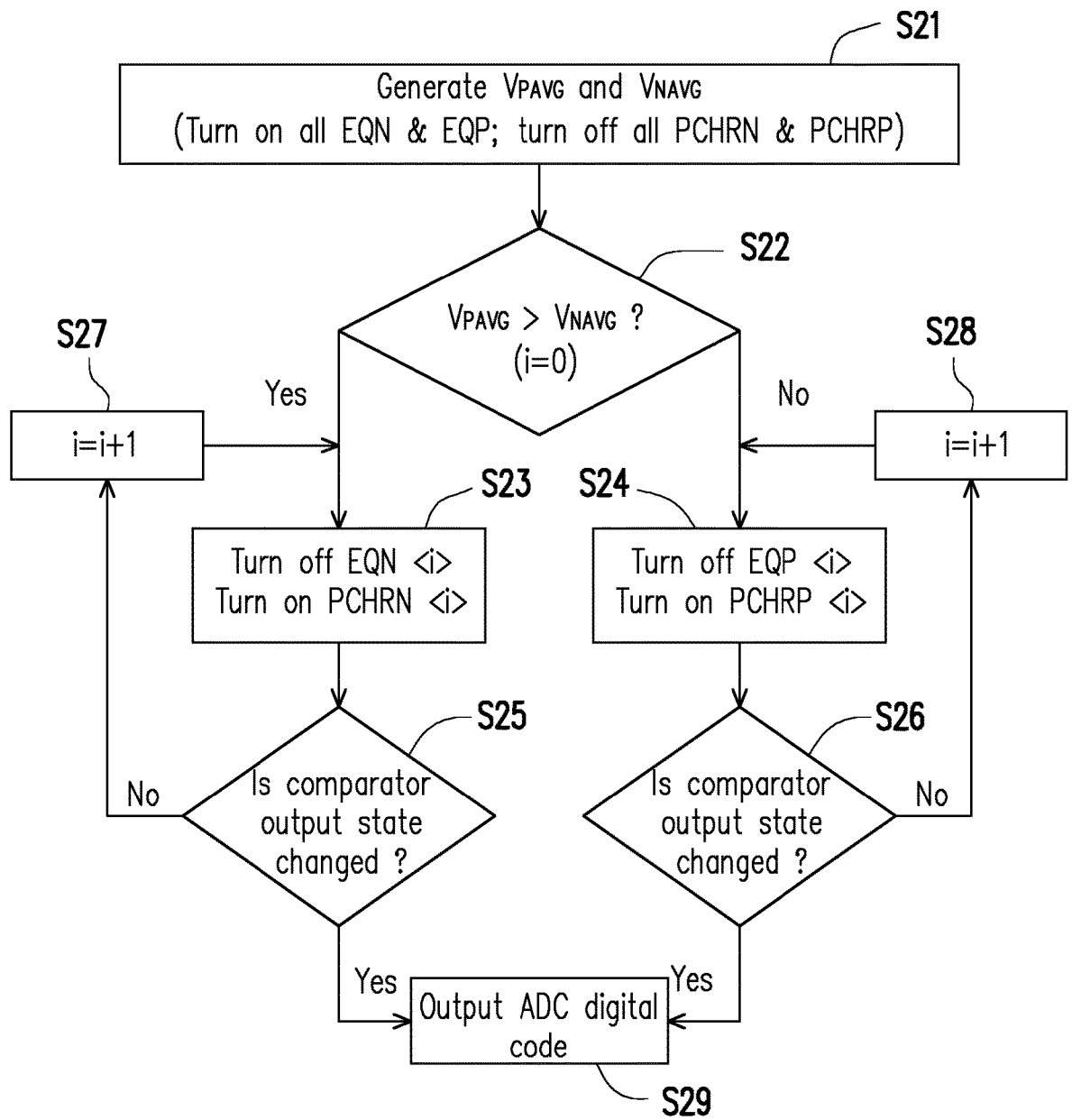
FIG. 2 is a flowchart diagram illustrates an analog-to-digital converting operation in accordance with some embodiments.

FIG. 2 is a flowchart diagram illustrates an analog-to-digital converting operation in accordance with some embodiments. Referring to FIG. 1 and FIG. 2, the average voltages $V_{PAVG}$ and $V_{NAVG}$ are generated in step S21, in which the average voltage $V_{PAVG}$ is generated according to the output voltages from the first bit lines LBLT<0> through LBLT<M>; and the average voltage $V_{NAVG}$ is generated according to the output voltages from the second bit lines LBLF<0> through LBLF<M>. In step S21, the control signals EQP1<0> through EQP1<M> and EQN1<0> through EQN1<M> are configured to turn on all the first switch pairs (e.g., switches SW01, SW02, SW11, SW12, SWM1 and SWM2) in the memory columns COL_0 through COL_M. Meanwhile, the control signals PCHRP<0> through PCHRP<M> and PCHRN<0> through PCHRN<M> are configured to turn off all the pre-charge switch pairs (e.g., SW03, SW04, SW13, SW14, SWM3 and SWM4) of the memory columns COL_0 through COL_M.

In step S22, the average voltage $V_{PAVG}$ is compared with the average voltage $V_{NAVG}$ by a comparator to determine which one is the lower average voltage and which one is the higher average voltage. When the average voltage $V_{PAVG}$ is greater than the average voltage $V_{NAVG}$, step S23 is performed; and when the average voltage $V_{PAVG}$ is not greater than the average voltage $V_{NAVG}$, step S24 is performed.

In step S23, when the average voltage $V_{PAVG}$ is greater than the average voltage $V_{NAVG}$, the average voltage $V_{PAVG}$ is the higher average voltage and the average voltage $V_{NAVG}$ is the lower average voltage. An incremental step is repeatedly performed to increment the lower average voltage (e.g., $V_{NAVG}$) by a step voltage until the output state of the comparator changes. In some embodiments, at least one memory column (e.g., memory column COL_i) among the memory columns COL_0 through COL_M are selected, the switch EQN<i> of the first switch pair of the at least one selected memory column COL_i is turned off and the pre-charge switch PCHRN<i> of the pre-charge switch pair in the at least one selected memory column COL_i is turned on so as to perform the incremental step. As a result of the incremental step, the step voltage is added to the lower average voltage.

Next, in step S25, it determines whether the output state of the comparator changes after performing the incremental step to the lower average voltage (e.g., $V_{NAVG}$). If the output state of the comparator changes, the digital code is generated according to the number of the incremental step performed to the lower average voltage (e.g., $V_{NAVG}$) in step S29. If the output state of the comparator does not change, another incremental step is performed with a selection of next memory columns (e.g., COL_(i+1), COL_(i+2), and so on) in step S27 until the output state of the comparator changes.

In step S24, when the average voltage $V_{PAVG}$ is not greater than the average voltage $V_{NAVG}$, the average voltage $V_{NAVG}$ is the higher average voltage and the average voltage $V_{PAVG}$ is the lower average voltage. An incremental step is repeatedly performed to increment the lower average voltage (e.g., $V_{PAVG}$) by a step voltage until the output state of the comparator changes. In some embodiments, at least one memory column (e.g., memory column COL_i) among the memory columns COL_0 through COL_M are selected, the switch EQP<i> of the first switch pair in the at least one selected memory column COL_i is turned off and the pre-charge switch PCHRP<i> of the pre-charge switch pair in the at least one selected memory column COL_i is turned on so as to perform the incremental step.

Next, in step S26, it determines whether the output state of the comparator changes after performing the incremental step to the lower average voltage (e.g., $V_{PAVG}$). If the output state of the comparator changes, the digital code is generated according to the number of the incremental step performed to the lower average voltage (e.g., $V_{PAVG}$) in step S29. If the output state of the comparator does not change, another incremental step is performed with a selection of next memory columns (e.g., COL_(i+1), COL_(i+2), and so on) in step S28 till the output state of the comparator changes.

In some embodiment, the incremental step is a one-step incremental operation, in which each time the one-step incremental operation is performed, a constant voltage (e.g., step voltage) is added to the lower average voltage. The constant voltage is determined according to the reference voltage Vref coupled to the pre-charge switch pair of each of the memory columns COL_0 through COL_M. For example, the incremental step to the lower average voltage (e.g., $V_{NAVG}$) may be determined according to the equation (1).

$$V_{NAVG}(t+1) = V_{NAVG}(t) + \frac{1}{M} Vref \quad (1)$$

As shown in equation (1), the step voltage depends on the reference voltage Vref but is independent from the signals $V_{NAVG}$ and $V_{PAVG}$. As such, the linearity of the digital output generated by an analog-to-digital converting operation in the in-memory computing apparatus is improved.

Figure 3A:
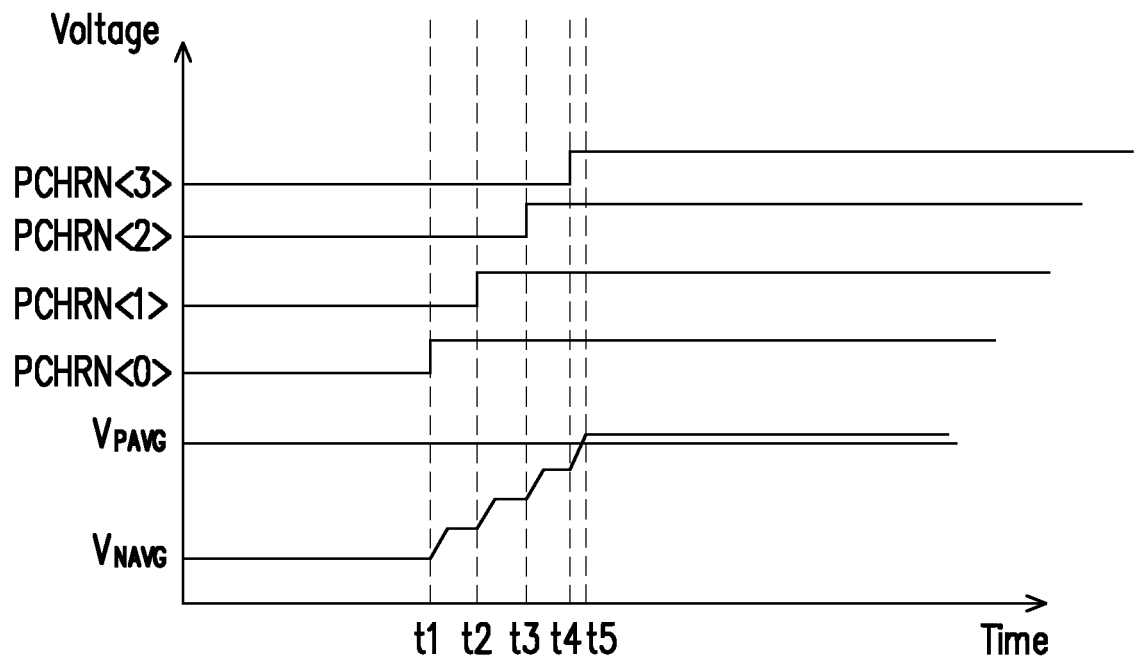
FIG. 3A through FIG. 3B are waveform diagrams illustrating one-step incremental operation and a binary-search incremental operation in accordance with some embodiments.

An exemplary waveform diagram of the incremental step (one-step incremental operation) is illustrated in FIG. 3A. As shown in FIG. 3A, the average voltage $V_{NAVG}$ is smaller than the average voltage $V_{PAVG}$ at the time point t1, and an incremental step is performed to increment the average voltage $V_{NAVG}$ by turning on the pre-charge switch using the control signal PCHRN<0> at the time point t1. After performing the incremental step at the time point t1, the average voltage $V_{NAVG}$ is still smaller than the average voltage $V_{PAVG}$. The incremental steps are repeatedly performed at the time points t2 through t4 by turning on the pre-charge switch using the control signals PCHRN<1> through PCHRN<3>, respectively. At the time point t5, the average voltage $V_{NAVG}$ is no longer smaller than the average voltage $V_{PAVG}$ (the output state of the comparator changes), the digital code will be generated according to the number of the incremental steps performed to the $V_{NAVG}$.

Figure 3B:
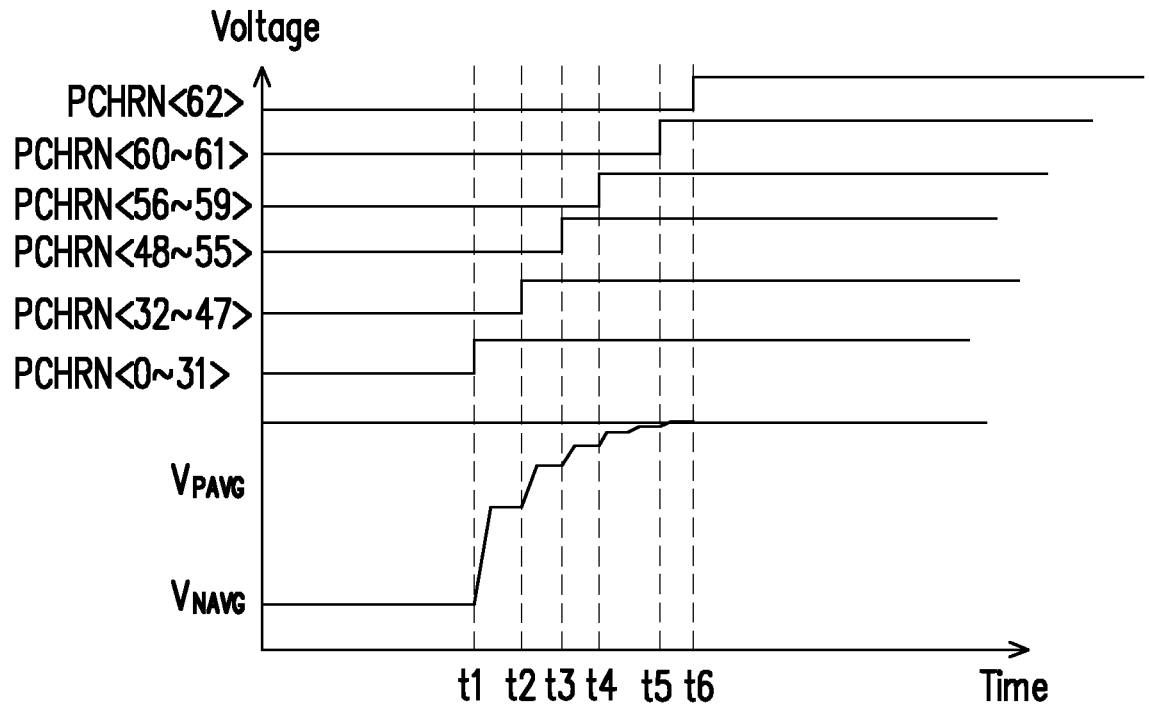

In some embodiments, the incremental step is a binary-search incremental operation which operates based on a binary-search algorithm. The binary-search incremental operation may quickly determine the step voltage that is added to the lower average voltage so as to change the output state of the comparator. As such, the power consumption is reduced when the binary-search incremental operation is used. An exemplary waveform diagram of the incremental step based on binary-search incremental operation is illustrated in FIG. 3B. In the example shown in FIG. 3B, there are 64 memory columns (e.g., M=64) in the memory array structure. At the time point t1, the average voltage $V_{NAVG}$ is smaller than the average voltage $V_{PAVG}$, thus the control signals PCHRN<0> through PCHRN<31> are used to turn on the corresponding pre-charge switches of the memory columns COL_0 through COL_31 in the binary-search incremental operation. At the time points t2 through t6, the average voltage $V_{NAVG}$ is still smaller than the average voltage $V_{PAVG}$. Accordingly, the control signals PCHRN<32> through PCHRN<47> are configured to turned on the corresponding pre-charge switches in memory columns COL_32 through COL_47 at time point t2; the control signals PCHRN<48> through PCHRN<55> are used to turned on the corresponding pre-charge switches in memory columns COL_48 through COL_55 at time point t3; the control signals PCHRN<56> through PCHRN<59> are used to turned on the corresponding pre-charge switches in memory columns COL_56 through COL_59 at time point t4; the control signals PCHRN<60> through PCHRN<61> are used to turned on the corresponding pre-charge switches in memory columns COL_60 through COL_61 at time point t5; and the control signal PCHRN<62> are used to turned on the corresponding pre-charge switches in memory columns COL_62 at time point t6. After performing the binary-search incremental operation at the time point t6, the average voltage $V_{NAVG}$ is no longer smaller than the average voltage $V_{PAVG}$ (e.g., the output state of the comparator changes). As such, the digital code of the will be generated according to the number of the incremental steps performed to the $V_{NAVG}$.

Figure 4:
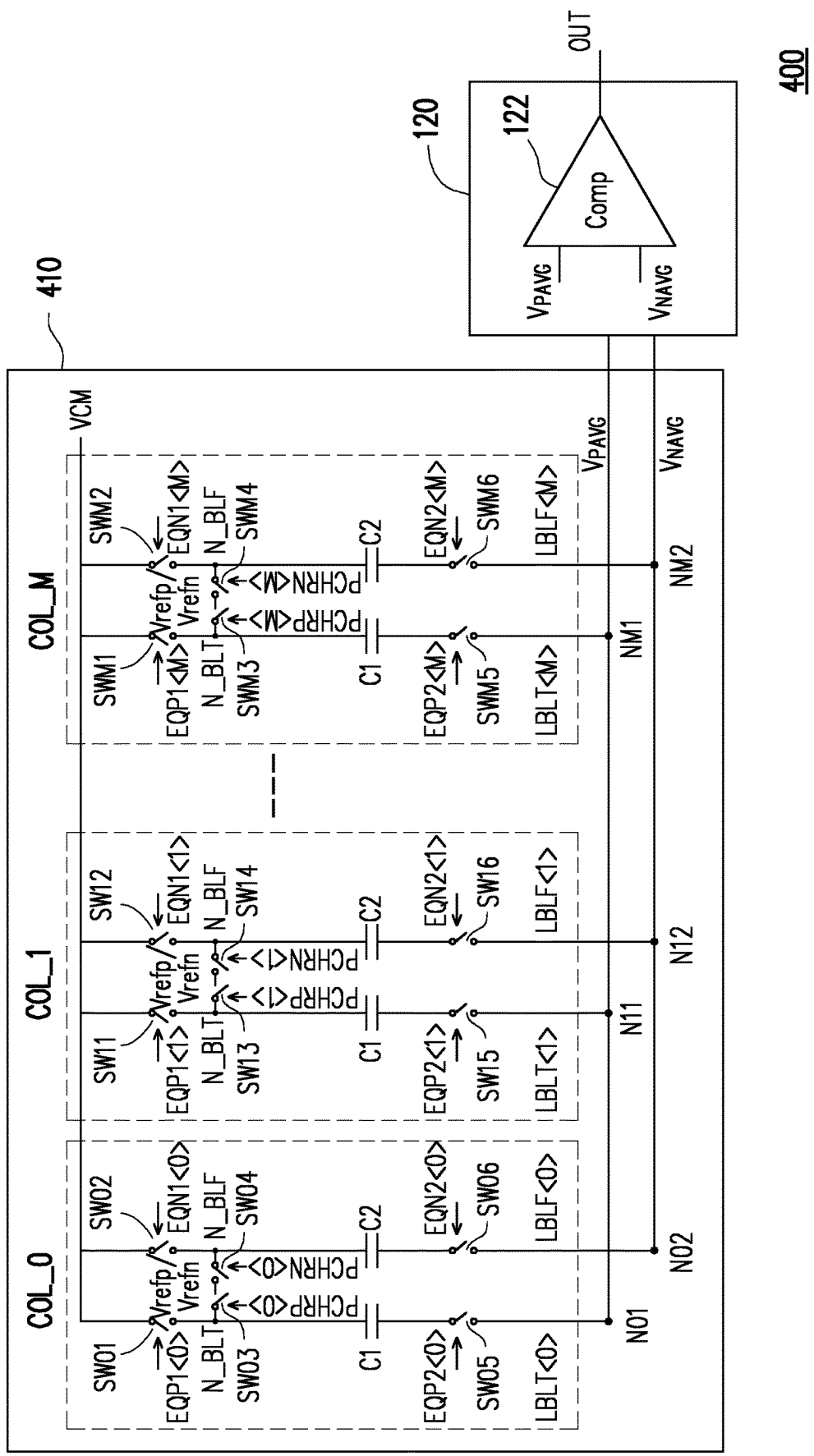
FIG. 4 is a schematic diagram illustrating an in-memory computing apparatus in accordance with some alternative embodiments.

Referring to FIG. 4, an in-memory computing apparatus 400 in accordance with some embodiments are illustrated. A difference between the in-memory computing apparatus 400 shown in FIG. 4 and the in-memory computing apparatus 100 shown in FIG. 1 is the memory array structure 110 and the memory array structure 410. In the memory array structure 410, the first switch pair in each of the memory columns COL_0 through COL_M is coupled to a reference voltage VCM instead of the ground node. In addition, in the memory array structure 110, the pre-charge switch pair in each of the memory column COL_0 through COL_M is coupled to the reference node that receives the reference voltage Vref. In the memory array structure 410, the pre-charge switch pair in each of the memory column COL_0 through COL_M is coupled to the reference node that may receive either Vrefn or Vrefp. In some embodiments, the relationship among the reference voltage VCM, Vref, Vrefp and Vrefn are illustrated in the equations (2) through (4), but the disclosure is not limited thereto.

$$VCM=\tfrac{1}{2}(Vrefn+Vrefp) \tag{2}$$

$$Vrefp-VCM=\tfrac{1}{2}Vref \tag{3}$$

$$VCM-Vrefn=\tfrac{1}{2}Vref \tag{4}$$

In some embodiments, the in-memory computing apparatus 400 may perform a differential operation, in which an incremental step is used to increment the lower average voltage and a decremental step is used to decrement the higher average voltage. In this way, a settling time is significantly improved. Referring to FIG. 4, the average voltage $V_{NAVG}$ is compared with the average voltage $V_{PAVG}$ to determine which one is the higher average voltage and which one is the lower average voltage. In some embodiments, the incremental step is performed to increment the lower average voltage while the decremental step is performed to the higher average voltage until the output state of the comparator is changed.

As an example, when a comparison result of the comparator indicates that the reference voltage $V_{NAVG}$ is smaller than the reference voltage $V_{NAVG}$, the incremental step is performed to the reference voltage $V_{NAVG}$ and the decremental step is performed to the reference voltage $V_{PAVG}$. To perform the incremental step to the reference voltage $V_{NAVG}$, at least one memory column (e.g., COL_i) among the memory columns COL_0 through COL_M is selected, and the control signal PCHRNL<i> is used to turn on the corresponding pre-charge switch of the at least one selected memory column COL_i to receive the reference voltage Vrefp. Meanwhiles, the EQN<i> is turned off to insulate the corresponding bit line from the voltage VCM. To perform the decremental step the reference voltage $V_{PAVG}$, at least one memory column (e.g., COL_i) among the memory columns COL_0 to COL_M is selected, and the pre-charge switch PCHRP<i> is used to turned on the corresponding pre-charge switch of the at least one selected memory column COL_i to receive the reference voltage Vrefn. The incremental step and the decremental step may be performed simultaneously and repeatedly until the output state of the comparator changes. In some embodiments, the different operation is performed according to the equation (5). The equation (5) may be obtained based on the constrains defined in equations (2) through (4).

$$V_{NAVG}(t+1) = V_{NAVG}(t) - V_{PAVG}(t) + \frac{1}{M}Vref \tag{5}$$

Figure 5:
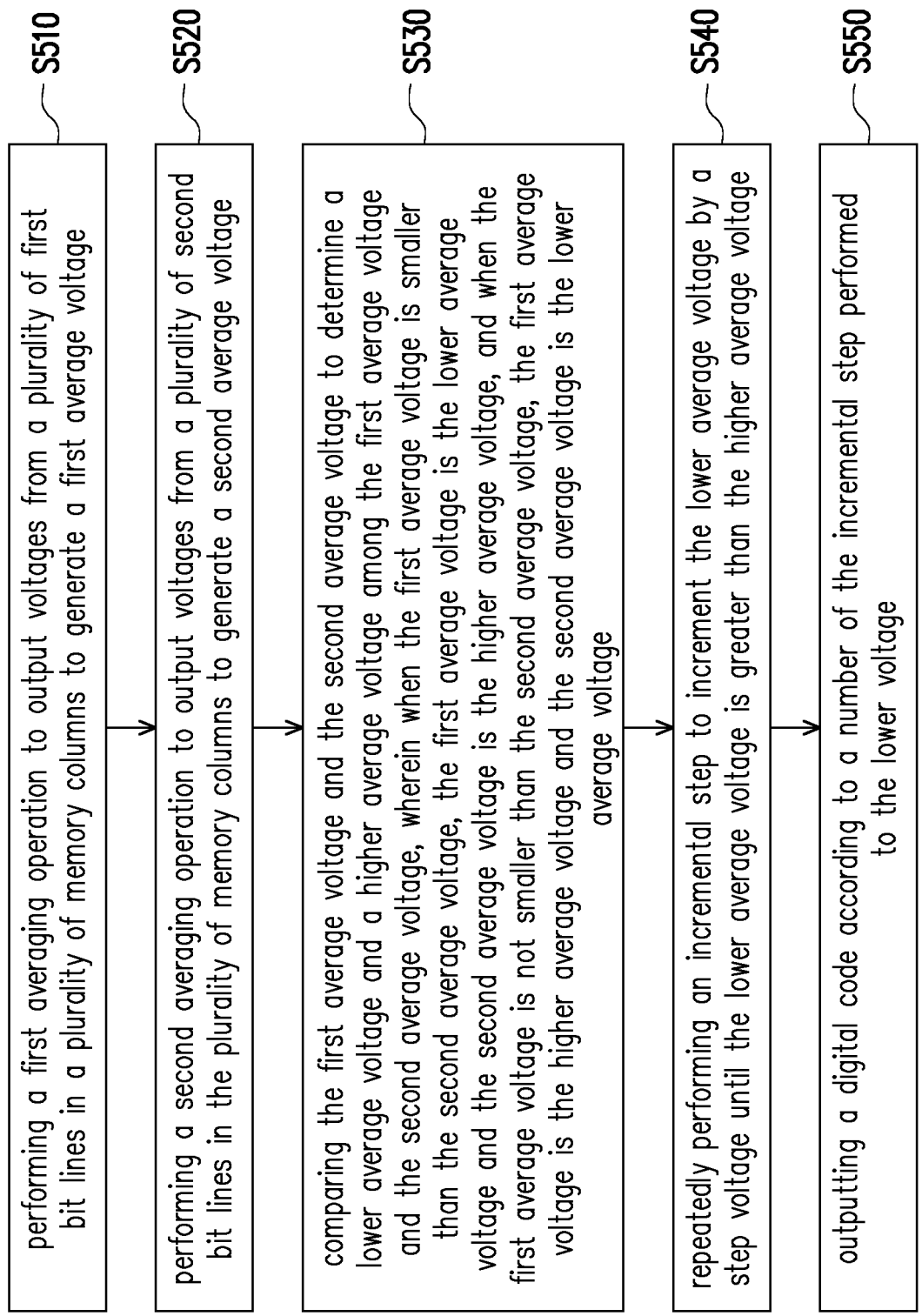
FIG. 5 is a flowchart diagram illustrating an analog-to-digital converting method in accordance with some embodiments.

Referring to FIG. 5, an analog-to-digital converting method in accordance with some embodiments is illustrated. In steps S510 and S520, a first averaging operation is performed to output voltages from a plurality of first bit lines in a plurality of memory columns to generate a first average voltage; and a second averaging operation is performed to output voltages from a plurality of second bit lines in the plurality of memory columns to generate a second average voltage. In step S530, the first average voltage is compared with the second average voltage to determine a lower average voltage and a higher average voltage among the first average voltage and the second average voltage. When the first average voltage is smaller than the second average voltage, the first average voltage is the lower average voltage and the second average voltage is the higher average voltage, and when the first average voltage is not smaller than the second average voltage, the first average voltage is the higher average voltage and the second average voltage is the lower average voltage. In some embodiments, when a level of the first average voltage is smaller than a level of the second average voltage, the first average voltage is the lower average voltage and the second average voltage is the higher average voltage, and vice versa.

In step S540, an incremental step is repeatedly performed to increment the lower average voltage by a step voltage until the lower average voltage is greater than the higher average voltage. In other words, each time the incremental step is performed, the step voltage which is independent from the average voltages is added to the lower average voltage. The incremental step is repeatedly performed until the lower average voltage is greater than the higher average voltage. In step S550, a digital code is outputted according to a number of the incremental step performed to the lower voltage.

Figure 6:
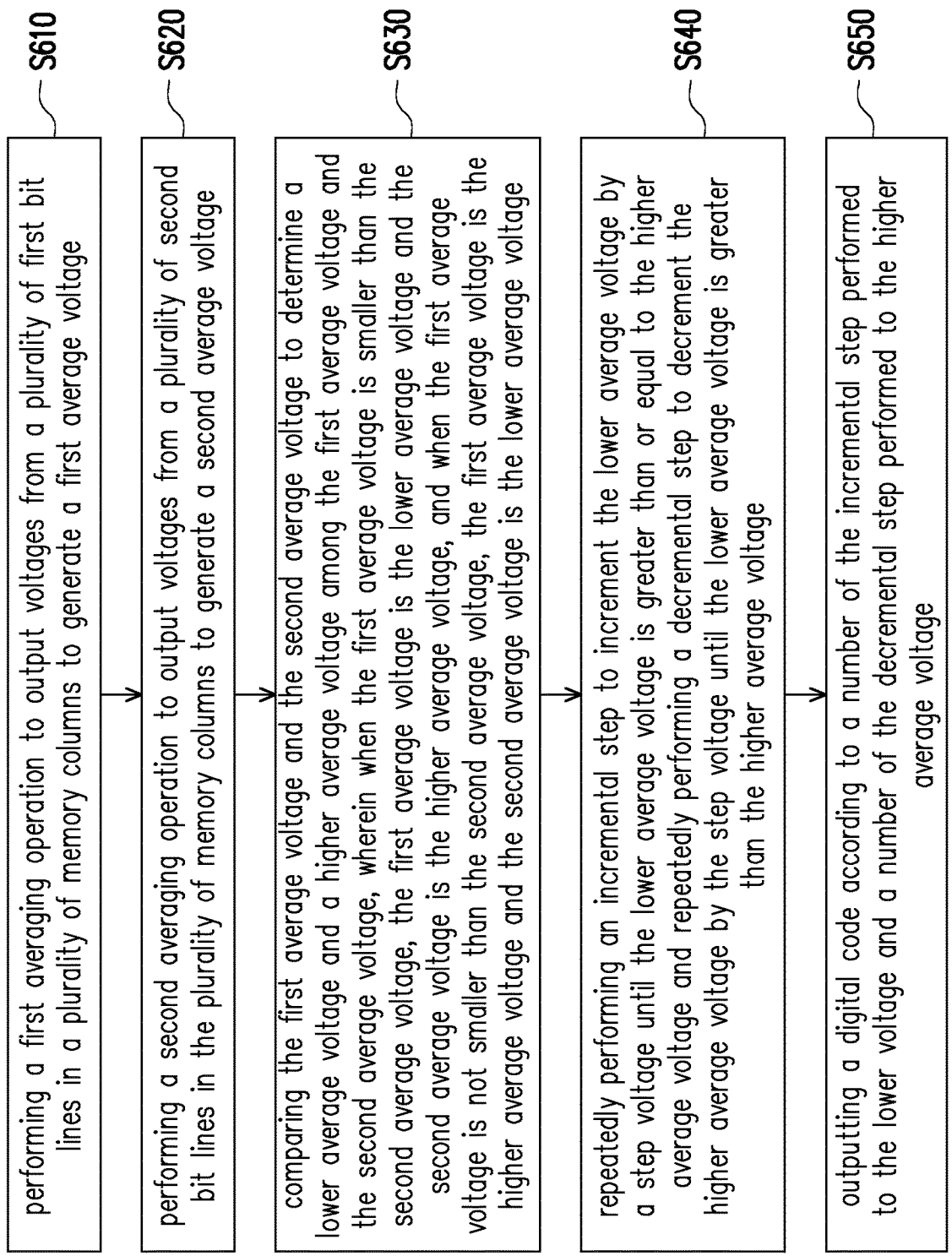
FIG. 6 is a flowchart diagram illustrating an analog-to-digital converting method in accordance with some alternative embodiments.

Referring to FIG. 6, an analog-to-digital converting method in accordance with some alternative embodiments is illustrated. In steps S610 and S620, a first averaging operation is performed to output voltages from a plurality of first bit lines in a plurality of memory columns to generate a first average voltage; and a second averaging operation is performed to output voltages from a plurality of second bit lines in the plurality of memory columns to generate a second average voltage. In step S630, the first average voltage is compared with the second average voltage to determine a lower average voltage and a higher average voltage among the first average voltage and the second average voltage. When the first average voltage is smaller than the second average voltage, the first average voltage is the lower average voltage and the second average voltage is the higher average voltage. When the first average voltage is not smaller than the second average voltage, the first average voltage is the higher average voltage and the second average voltage is the lower average voltage.

In step S640, an incremental step and a decremental step are repeatedly performed until the lower average voltage is greater than the higher average voltage. The incremental step is configured to increment the lower average voltage by a step voltage, and the decremental step is configured to decrement the higher average voltage by the step voltage. In step S650, a digital code is outputted according to the number of the incremental step performed to the lower voltage and the number of the decremental step performed to the higher average voltage.

In accordance with some embodiments of the disclosure, a comparison operation is performed to determine a lower average voltage and a higher average voltage; and an incremental step is repeatedly performed to increment the lower average voltage until the lower average voltage is no longer smaller than the higher average voltage. The step voltage added to the lower average voltage each time the incremental step is perform is signal independent, thus the linearity of a digital code outputted by an analog-to-digital converting operation is improved. In some embodiments, in addition to a one-step incremental operation, a binary-search incremental operation may be performed to quickly locate the step voltage in the incremental step, thereby saving processing time and power consumption. Furthermore, in some embodiments, a decremental step and the incremental step are performed simultaneously to significantly reduce the settling time, wherein the incremental step is configured to increment the lower average voltage and the decremental step is configured to decrement the higher average voltage.

In accordance with some embodiments, a memory array structure that includes a plurality of memory columns is introduced. The plurality of memory columns includes a plurality of first bit lines and a plurality of second bit lines. Each of the plurality of memory columns includes a bit line pair, a pre-charge switch pair and a first switch pair. The bit line pair includes a first bit line and a second bit line, wherein the first bit line is one of the plurality of first bit lines and the second bit line is one of the plurality of second bit lines. The pre-charge switch pair includes a first pre-charge switch and a second pre-charge switch, wherein the first pre-charge switch is coupled to the first bit line and the second pre-charge switch is coupled to the second bit line. The first switch pair includes a first switch and a second switch, wherein the first switch is coupled to the first bit line and the second switch is coupled to the second bit line. Output voltages from the plurality of first bit lines are used to generated a first average voltage, output voltages from the plurality of second bit lines are used to generated a second average voltage, one of the first average voltage and the second average voltage is a lower average voltage and another one of the first average voltage and the second average voltage is a higher average voltage. The pre-charge switch pair and the first switch pair of a selected memory column among the plurality of memory columns are controlled to repeatedly perform an incremental step to increment the lower average voltage by a step voltage until the lower average voltage is greater than the higher average voltage.

In accordance with some embodiments, an in-memory computing apparatus which includes a memory structure and a comparator is introduced. The memory structure includes a plurality of memory columns with a plurality of first bit lines and a plurality of second bit lines. The comparator is configured to compare the first average voltage and the second average voltage to determine a lower average voltage and a higher average voltage among the first average voltage and the second average voltage. Each of the plurality of memory columns includes a bit line pair, a pre-charge switch pair and a first switch pair. The bit line pair includes a first bit line and a second bit line, wherein the first bit line is one of the plurality of first bit lines and the second bit line is one of the plurality of second bit lines. The pre-charge switch pair includes a first pre-charge switch and a second pre-charge switch, wherein the first pre-charge switch is coupled to the first bit line and the second pre-charge switch is coupled to the second bit line. The first switch pair includes a first switch and a second switch, wherein the first switch is coupled to the first bit line and the second switch is coupled to the second bit line. Output voltages from the plurality of first bit lines are used to generated a first average voltage, output voltages from the plurality of second bit lines are used to generated a second average voltage, one of the first average voltage and the second average voltage is a lower average voltage and another one of the first average voltage and the second average voltage is a higher average voltage. The pre-charge switch pair and the first switch pair of a selected memory column among the plurality of memory columns are controlled to repeatedly perform an incremental step to increment the lower average voltage by a step voltage until the lower average voltage is greater than the higher average voltage.

In accordance with some embodiments, an analog-to-digital converting method are introduced. The analog-to-digital converting method includes steps of performing a first averaging operation to output voltages from a plurality of first bit lines in a plurality of memory columns to generate a first average voltage; performing a second averaging operation to output voltages from a plurality of second bit lines in the plurality of memory columns to generate a second average voltage; comparing the first average voltage and the second average voltage to determine a lower average voltage and a higher average voltage among the first average voltage and the second average voltage; repeatedly performing an incremental step to increment the lower average voltage by a step voltage until the lower average voltage is greater than the higher average voltage; and outputting a digital code according to a number of the incremental step performed to the lower voltage.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A memory array structure, comprising:
a plurality of memory columns, comprising a plurality of first bit lines and a plurality of second bit lines, wherein each of the plurality of memory columns comprises:
a bit line pair, comprising a first bit line and a second bit line, wherein the first bit line is one of the plurality of first bit lines and the second bit line is one of the plurality of second bit lines;
a pre-charge switch pair, comprising a first pre-charge switch and a second pre-charge switch, wherein the first pre-charge switch is coupled to the first bit line and the second pre-charge switch is coupled to the second bit line; and
a first switch pair, comprising a first switch and a second switch, wherein the first switch is coupled to the first bit line and the second switch is coupled to the second bit line,
wherein output voltages from the plurality of first bit lines are used to generated a first average voltage,
output voltages from the plurality of second bit lines are used to generated a second average voltage,
when the first average voltage is smaller than the second average voltage, the first average voltage is a lower average voltage and the second average voltage is a higher average voltage,
when the first average voltage is not smaller than the second average voltage, the first average voltage is the higher average voltage and the second average voltage is the lower average voltage,
wherein the pre-charge switch pair and the first switch pair of a selected memory column among the plurality of memory columns are controlled to repeatedly perform an incremental step to increment the lower average voltage by a step voltage until the lower average voltage is greater than the higher average voltage.

2. The memory array structure of claim 1, wherein the selected memory column is determined according to a comparison result between the first average voltage and the second average voltage.

3. The memory array structure of claim 1, wherein the step voltage is determined according to a pre-determined reference voltage, and
the step voltage is independent from the first average voltage and the second average voltage.

4. The memory array structure of claim 1, wherein the first pre-charge switch is coupled between the first bit line and a first reference node, and the second pre-charge switch is coupled between the second bit line and the first reference node, and
the first switch is coupled between the first bit line and a second reference node, and the second switch is coupled between the second bit line and the second reference node, wherein the first reference node receives a first reference voltage, the second reference node receives a second reference voltage, and the first reference voltage is greater than the second reference voltage.

5. The memory array structure of claim 4, wherein each of the plurality of memory columns further comprises:
a second switch pair, comprising a third switch and a fourth switch, wherein the third switch is coupled to the first bit line and the fourth switch is coupled to the second bit line; and
a capacitor pair, comprising a first capacitor and a second capacitor, wherein the first capacitor of the capacitor pair is coupled between the third switch of the second switch pair and a connection node between the first pre-charge switch of the pre-charge switch pair and the first switch of the first switch pair, and the second capacitor of the capacitor pair is coupled between the fourth switch of the second switch pair and a connection node between the second pre-charge switch of the pre-charge switch pair and the second switch of the first switch pair.

6. The memory array structure of claim 5, wherein before the incremental step, the pre-charge pair of each of the plurality of memory columns are turned off and the first switch pair of each of the plurality of memory columns are turned on, and
during the incremental step, a switch among the first switch and the second switch of the selected memory column being associated with the lower average voltage is turned off, and a pre-charge switch among the first pre-charge switch and the second pre-charge switch of the selected memory column being associated with the lower average voltage is turned on.

7. The memory array structure of claim 1, wherein the pre-charge switch pair and the first switch pair of the selected memory column among the plurality of memory columns are further controlled to repeatedly perform a decremental step to decrement the higher average voltage until the lower average voltage is greater than the higher average voltage, and
the incremental step to increment the lower average voltage and the decremental step to decrement the higher average voltage are performed simultaneously.

8. An in-memory computing apparatus, comprising:
a memory structure, comprising a plurality of memory columns with a plurality of first bit lines and a plurality of second bit lines; and a comparator, configured to compare the first average voltage and the second average voltage to determine a lower average voltage and a higher average voltage among the first average voltage and the second average voltage, when the first average voltage is smaller than the second average voltage, the first average voltage is the lower average voltage and the second average voltage is the higher average voltage, and when the first average voltage is not smaller than the second average voltage, the first average voltage is the higher average voltage and the second average voltage is the lower average voltage,
wherein each of the plurality of memory columns comprises:
a bit line pair, comprising a first bit line and a second bit line, wherein the first bit line is one of the plurality of first bit lines and the second bit line is one of the plurality of second bit lines;
a pre-charge switch pair, comprising a first pre-charge switch and a second pre-charge switch, wherein the first pre-charge switch is coupled to the first bit line and the second pre-charge switch is coupled to the second bit line; and
a first switch pair, comprising a first switch and a second switch, wherein the first switch is coupled to the first bit line and the second switch is coupled to the second bit line,
wherein output voltages from the plurality of first bit lines are used to generated a first average voltage, output voltages from the plurality of second bit lines are used to generated a second average voltage,
wherein the pre-charge switch pair and the first switch pair of a selected memory column among the plurality of memory columns are controlled to repeatedly perform an incremental step to increment the lower average voltage by a step voltage until the lower average voltage is greater than the higher average voltage.

9. The in-memory computing apparatus of claim 8, wherein
the selected memory column is determined according to a comparison result between the first average voltage and the second average voltage.

10. The in-memory computing apparatus of claim 8, the step voltage is determined according to a pre-determined reference voltage, and
the step voltage is independent from the first average voltage and the second average voltage.

11. The in-memory computing apparatus of claim 8, wherein each of the plurality of memory columns further comprises:
a second switch pair, comprising a third switch and a fourth switch, wherein the third switch is coupled to the first bit line and the fourth switch is coupled to the second bit line; and
a capacitor pair, comprising a first capacitor and a second capacitor, wherein
the first capacitor of the capacitor pair is coupled between the third switch of the second switch pair and a connection node between the first pre-charge switch of the pre-charge switch pair and the first switch of the first switch pair,
the second capacitor of the capacitor pair is coupled between the fourth switch of the second switch pair and a connection node between the second pre-charge switch of the pre-charge switch pair and the second switch of the first switch pair, the first pre-charge switch is coupled between the first bit line and a first reference node, and the second pre-charge switch is coupled between the second bit line and the first reference node, and the first switch is coupled between the first bit line and a second reference node, and the second switch is coupled between the second bit line and the second reference node, wherein the first reference node receives a first reference voltage, the second reference node receives a second reference voltage, and the first reference voltage is greater than the second reference voltage.

12. The memory array structure of claim 11, wherein before the incremental step, the pre-charge pair of each of the plurality of memory columns are turned off and the first switch pair of each of the plurality of memory columns are turned on, and during the incremental step, a switch associated with the lower average voltage among the first switch and the second switch of the selected memory column is turned off, and a pre-charge switch associated with the lower average voltage among the first pre-charge switch and the second pre-charge switch of the selected memory column is turned on.

13. The memory array structure of claim 8, wherein the pre-charge switch pair and the first switch pair of the selected memory column among the plurality of memory columns are further controlled to repeatedly perform a decremental step to decrement the higher average voltage until the lower average voltage is greater than the higher average voltage, and the incremental step to increment the lower average voltage and the decremental step to decrement the higher average voltage are performed simultaneously.

14. An analog-to-digital converting method, comprising:

performing a first averaging operation to output voltages from a plurality of first bit lines in a plurality of memory columns to generate a first average voltage;

performing a second averaging operation to output voltages from a plurality of second bit lines in the plurality of memory columns to generate a second average voltage;

comparing the first average voltage and the second average voltage to determine a lower average voltage and a higher average voltage among the first average voltage and the second average voltage, wherein when the first average voltage is smaller than the second average voltage, the first average voltage is the lower average voltage and the second average voltage is the higher average voltage, and when the first average voltage is not smaller than the second average voltage, the first average voltage is the higher average voltage and the second average voltage is the lower average voltage;

repeatedly performing an incremental step to increment the lower average voltage by a step voltage until the lower average voltage is greater than the higher average voltage; and outputting a digital code according to a number of the incremental step performed to the lower voltage.

15. The analog-to-digital converting method of claim 14, wherein repeatedly performing the incremental step comprises:

determining a selected memory column among the plurality of memory columns according to a comparison result between the first average voltage and the second average voltage; and controlling a pre-charge switch pair and a first switch pair of the selected memory column to repeatedly perform the incremental step.

16. The analog-to-digital converting method of claim 14, wherein the step voltage is determined according to a pre-determined reference voltage, and the step voltage is independent from the first average voltage and the second average voltage.

17. The analog-to-digital converting method of claim 16, wherein each of the plurality of memory columns comprises:

a bit line pair, comprising a first bit line and a second bit line, wherein the first bit line is one of the plurality of first bit lines and the second bit line is one of the plurality of second bit lines;

a capacitor pair, comprising a first capacitor and a second capacitor, wherein the first capacitor is associated with the first bit line and the second capacitor is associated with the second bit line;

a pre-charge switch pair, comprising a first pre-charge switch and a second pre-charge switch, wherein the first pre-charge switch is coupled between the first bit line and a first reference node, and the second pre-charge switch is coupled between the second bit line and the first reference node; and a switch pair, comprising a first switch and a second switch, wherein the first switch is coupled between the first bit line and a second reference node, and the second switch is coupled between the second bit line and the second reference node, wherein the first reference node receives a first reference voltage, the second reference node receives a second reference voltage, and the first reference voltage is greater than the second reference voltage.

18. The analog-to-digital converting method of claim 17, wherein the incremental step comprises:

turning off a switch associated with the lower average voltage among the first switch and the second switch of a selected memory column among the plurality of memory columns; and turning on a pre-charge switch associated with the lower average voltage among the first pre-charge switch and the second pre-charge switch of a selected memory column, wherein the selected memory column is determined according a comparison result between the first average voltage and the second average voltage.

19. The analog-to-digital converting method of claim 17, wherein before repeatedly performing the incremental step to increment the lower average voltage, the pre-charge pair of each of the plurality of memory columns are turned off and the first switch pair of each of the plurality of memory columns are turned on.

20. The analog-to-digital converting method of claim 14, further comprising:

repeatedly performing a decremental step to decrement the higher average voltage until the lower average voltage is greater than the higher average voltage, wherein the incremental step to increment the lower average voltage and the decremental step to decrement the higher average voltage are performed simultaneously.

* * * * *